United States Patent [19]

Iwatsuki et al.

[11] Patent Number: 5,783,965
[45] Date of Patent: Jul. 21, 1998

[54] BIAS CIRCUIT

[75] Inventors: Hajime Iwatsuki; Hideo Sugawara, both of Kawasaki, Japan

[73] Assignee: Fujitsu Limited, Kanagawa, Japan

[21] Appl. No.: 663,904

[22] Filed: Jun. 14, 1996

[30] Foreign Application Priority Data

Sep. 20, 1995 [JP] Japan .................. 7-241903

[51] Int. Cl.⁶ .................................................. H01J 19/82
[52] U.S. Cl. ...................... 327/532; 327/531; 327/557; 333/32
[58] Field of Search ........................ 327/530–532, 327/551, 552, 557, 558, 559, 307, 362, 427, 478; 333/32, 245

[56] References Cited

U.S. PATENT DOCUMENTS

| | | | |
|---|---|---|---|
| 4,410,864 | 10/1983 | Muterspaugh et al. | 333/32 |
| 4,476,446 | 10/1984 | Blight | 333/32 |
| 4,812,686 | 3/1989 | Morse | 327/362 |
| 5,309,124 | 5/1994 | Cazaux et al. | 333/32 |
| 5,357,148 | 10/1994 | Rotay | 327/538 |
| 5,578,961 | 11/1996 | Fajen et al. | 327/307 |

*Primary Examiner*—Toan Tran
*Attorney, Agent, or Firm*—Helfgott & Karas, P.C.

[57] ABSTRACT

A transistor bias circuit which achieves stable operation in a multistage-connected amplifier circuit or in a compound circuit is formed, for example, by a transistor amplifier and a mixer. The transistor bias circuit, which establishes the operating point of a transistor, has an input biasing circuit which is connected to a signal input terminal of the transistor and which applies a bias current to this input terminal from a power supply. The input biasing circuit has an input frequency selection unit which passes an AC input signal input to the transistor signals input terminal within a prescribed frequency band, and which attenuates an AC input signal input to the transistor signal input terminal outside the prescribed frequency band.

11 Claims, 18 Drawing Sheets

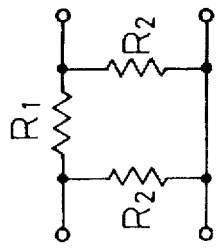
PRIOR ART Fig.5(d)
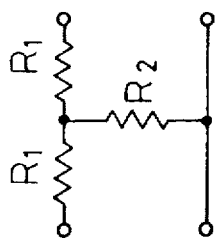
PRIOR ART Fig.5(c)
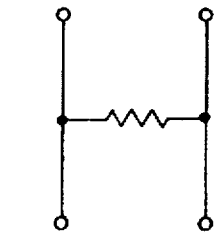
PRIOR ART Fig.5(b)
PRIOR ART Fig.5(a)
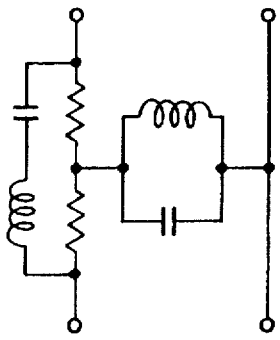
PRIOR ART Fig.5(e)

BIAS CIRCUIT

BACKGROUND OF THE INVENTION

1. Field of the Invention

The present invention relates to a transistor amplifier and mixer circuit which are operated by a voltage-feedback bias circuit, and more particularly to technology for achieving stable operation with a simple circuit configuration when configuring a compound circuit formed by a multistage transistor amplifier or by a transistor amplifier and a mixer or the like.

2. Description of Prior Art

In the prior art, lumped-constant inductors and distributed-constant paths (λg/4) are used as inductive elements in voltage-feedback circuits of a transistor amplifiers. In recent years, with portable radio terminals such as cellular telephones, which have rapidly become popular and are being required to operate at low voltages of 5 to 3 volts, to avoid a loss of dynamic range due to the emitter bias resistance of the said current-feedback circuit, instead of a current-feedback type bias circuit, in which the transistor's emitter is grounded via a bias resistance, a voltage-feedback type of bias circuit, in which the emitter of the transistor is grounded directly, is often used.

However, the above-described prior art configuration is accompanied by various problems, as described below.

The first problem is that, because the gain of a bipolar transistor at low frequencies is high, the gain in the region of the signal of interest is lower than the low-frequency gain, so that if a connection is made to form a multistage transistor amplifier using transistor amplifiers for which the gain is adjusted at the frequency of the signal of interest, there is a danger of low-frequency oscillation occurring.

The second problem is that, when a load, such as a filter circuit, which is fully reflective outside its passband is connected to the output side of a transistor amplifier, if the isolation is small relative to the gain of the transistor, electrical power greater than the transistor input level returns to the input side, thereby causing a negative resistance, so that if a fully reflective load is connected to the input side as well, reflection occurs there as well, the level thereof possibly leading to oscillation. With regard to filters in particular, at frequencies near the skirt of the filter characteristics, at which the response of the filter changes sharply, phase rotation increases in speed, causing a tendency to oscillate.

For this reason, in a multistage amplifier configuration in the past, an impedance-matching circuit was provided between each of the stages. However, in implementing an impedance matching circuit with resistive elements only, the application of such elements in a receiving system causes attenuation of the signal, leading to the problem of a deterioration in the noise figure. Additionally, the use of a bridged-Tee circuit makes the circuit large, making a compact implementation difficult.

In addition, in the case of a compound circuit formed from a low-noise amplifier and a mixer circuit, and added to the above problems, the problem described below occurs.

When a high-level low-frequency signal is input to a low-noise amplifier, a harmonic signal is generated therewithin, and if the frequency thereof coincides with the frequency of interest, this can cause interference to reception. It is not possible to solve this problem even by inserting a filter between the low-noise amplifier and the mixer circuit, the problem only being solvable by providing a filter for this purpose at the input side of the low-noise amplifier.

However, because the said filter must have a prescribed attenuation at image frequencies and local frequencies, requiring the filter also to have 5/2, 5/3, . . . , attenuation characteristics, where f is the frequency of interest, the insertion loss of the filter is increased, thereby presenting an obstacle to achieving overall low noise in the receiving circuit.

SUMMARY OF THE INVENTION

In consideration of the drawbacks, an object of the present invention is to solve the problems by imparting to a bias circuit the function of an impedance-matching circuit, without having to add a complex impedance-matching circuit or the like. That is, by only adding simple circuit elements to a simple bias circuit of the past, the low-frequency gain is reduced without attenuating the signal frequency and further, by trapping unwanted frequencies, the present invention seeks to ensure stable operation of these circuits, even in the case of a multistage amplifier or compound circuit configuration.

According to the present invention, a bias circuit which establishes the operating point of a transistor is provided, this bias circuit having an input biasing means which is connected in parallel with a signal input terminal, and which applies a bias current to the signal input terminal from a power supply, the said input biasing means being provided with an input frequency selection means which passes an AC input signal input to the said transistor signal input terminal within a prescribed frequency band, and which attenuates an AC input signal input to the said transistor signal input terminal outside the prescribed frequency band.

According to the present invention, a bias circuit which establishes the operating point of a transistor is provided, this bias circuit having an output biasing means which is connected in parallel with a signal output terminal, and which applies a bias current to the signal output terminal from a power supply, the said output biasing means being provided with an output frequency selection means which passes an AC output signal output from the said transistor signal output terminal within a prescribed frequency band, and which attenuates an AC output signal output from the said transistor signal output terminal outside the prescribed frequency band.

In addition, according to the present invention, this bias circuit has an input biasing means which is connected in parallel with a signal input terminal, and which applies a bias current to the signal input terminal from a power supply, the said input biasing means being provided with an input frequency selection means which passes an AC input signal input to the said transistor signal input terminal within a prescribed frequency band, and which attenuates an AC input signal input to the said transistor signal input terminal outside the prescribed frequency band, and further has an output biasing means which is connected in parallel with a signal output terminal, and which applies a bias current to the signal output terminal from a power supply, the said output biasing means being provided with an output frequency selection means which passes an AC output signal output from the said transistor signal output terminal within a prescribed frequency band, and which attenuates an AC output signal output from the said transistor signal output terminal outside the prescribed frequency band.

The said input frequency selection means attenuates low-frequency components and passes high-frequency components of the said AC input signal, thereby compensating the gain versus frequency characteristics of the transistor. The output frequency selection means passes the intermediate frequency IF, while attenuating radio frequencies (RF) and the local oscillator frequency, LF. The said input frequency selection means and output frequency selection means are formed as resonant circuits which are made up of resistors, capacitors, and lumped-constant inductors, or of resistors, capacitors, and distributed-constant paths.

BRIEF DESCRIPTION OF THE DRAWINGS

The present invention will be more clearly understood from the description as set forth below, with reference being made to the accompanying drawings, wherein

FIGS. 5(a) through 5(e) are circuit diagrams which show impedance-matching circuits in the prior art;

DESCRIPTION OF PREFERRED EMBODIMENTS

Before describing the present invention, art related to the present invention will be described.

Figure 1:
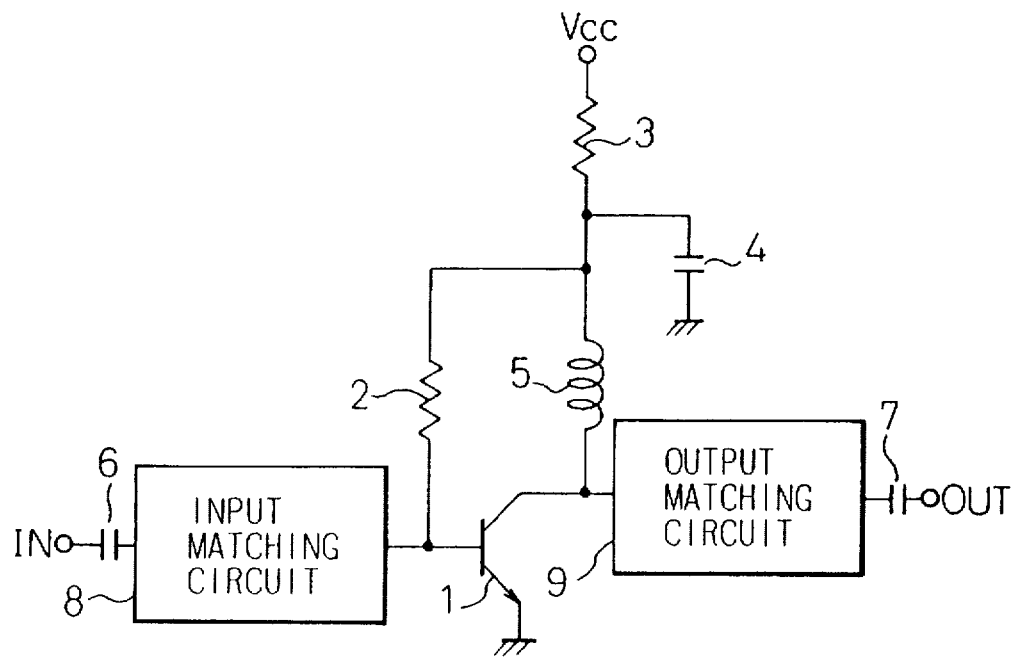
FIG. 1 is a circuit diagram which shows an example of a bias circuit of a transistor amplifier in the prior art.
Figure 2:
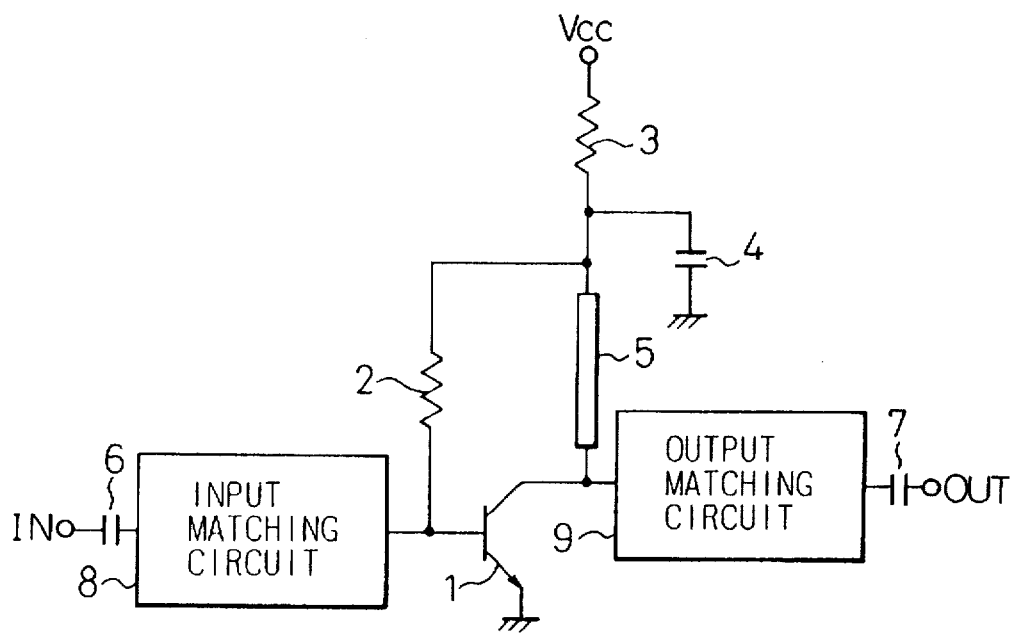
FIG. 2 is a circuit diagram which shows another example of a bias circuit of a transistor amplifier in the prior art.

FIG. 1 and FIG. 2 each show examples of the voltage-feedback bias circuit of a transistor amplifier circuit as used in the prior art.

Since the only difference between FIG. 1 and FIG. 2 is that, in the bias circuit of FIG. 1, a lumped-constant inductor is used as the inductive element, whereas in the bias circuit of FIG. 2, a distributed-constant line ($\lambda g/4$) is used as the inductive element, the description to follow will use the circuit of FIG. 1.

In FIG. 1, transistor 1, the emitter of which is grounded, forms a common-emitter type amplifier, bias being applied to the base, from the power supply $V_{cc}$, via the series-connected resistance ($R_c$) 3 and the resistance ($R_s$) 2. The collector bias current is applied, from the power supply compound-connection configuration of an amplifier and a mixer in the related $V_{cc}$, via the resistance 3.

Because a high resistance in the order of several kilohms is the said resistance 2, as seen from the base side, the bias circuit presents a high impedance with respect to the signal frequency. Also, because a resistance of several hundred ohms is used as resistance 3 to achieve a large output current, inductor 5 (a micro-strip line ($\lambda g/4$) in the case of FIG. 2) is used as a choke coil, so that the bias circuit appears as a high impedance at the signal frequency when seen from the collector side as well.

Capacitor 4 is provided to bypass high-frequency output signal leakage to ground, while capacitors 6 and 7 are for the purpose of providing AC coupling. The input matching circuit and output matching circuit are impedance-matching circuits for the purpose of maximizing the output or gain, or for achieving low-noise.

The reason for using in this application a voltage-feedback type bias circuit, in which the emitter of the transistor is grounded directly, rather than a current-feedback type bias circuit in which the emitter is grounded via a bias resistor, is that, with the requirement for portable radio terminals, such as the cellular telephones which have show rapid growth in usage in recent years, to operate at a low voltage of 5 V to 3 V, the latter circuit type avoids the loss of dynamic range caused by the emitter bias resistance in the said current-feedback type circuit cf.

Figure 3:
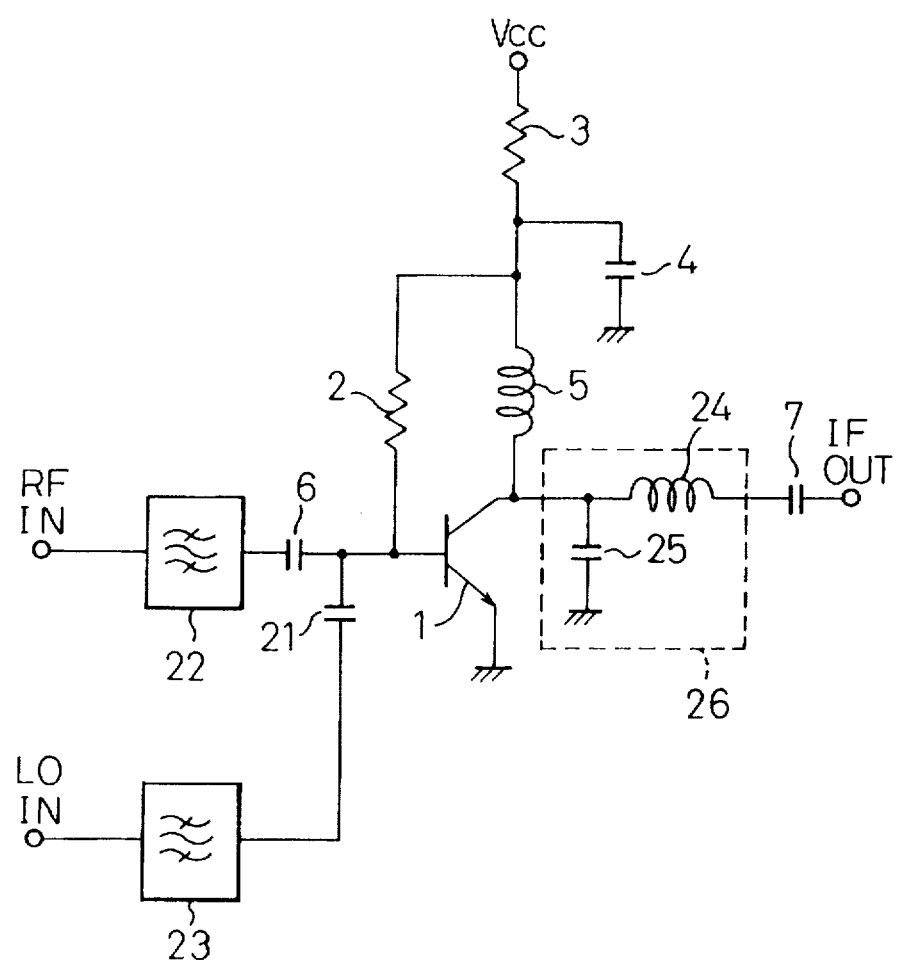
FIG. 3 is a circuit diagram which shows an example of a bias circuit of a transistor mixer circuit in the prior art.

FIG. 3 shows an example of a bias circuit of a transistor mixer circuit in the prior art.

Because the circuit configuration of FIG. 3 is similar to that described above, it will not be further described herein. The mixer function is achieved by the non-linear diode characteristics between the base and emitter of the transistor 1.

The bandpass filters 22 and 23 at the input of the said circuit are for the purpose of eliminating noise components from the radio-frequency signal (hereinafter referred to as the RF signal) and the local oscillator signal (hereinafter referred to as the LO signal), respectively, which are input to the mixer circuit. The lowpass filter 26 at the output is for the purpose of eliminating from the intermediate-frequency signal derived by the mixing action (hereinafter referred to as the IF signal) the harmonic component thereof and eliminating leakage of the RF and LO signals to the IF OUT terminal.

However, a transistor circuit of the prior art configured as described above has a variety of problems, as described below.

The first problem is that, because the gain of a bipolar transistor at low frequencies is high, the gain in the region of the signal of interest is lower than the low-frequency gain, so that if connection is made to form a multistage transistor amplifier using transistor amplifiers for which the gain is adjusted at the frequency of the signal of interest, there is a danger of low-frequency oscillation occurring.

The second problem is that, when a load such as a filter circuit, which is fully reflective outside its passband, is connected to the output side of a transistor amplifier, if the isolation is small relative to the gain of the transistor, electrical power greater than the transistor input level returns to the input side, thereby causing a negative resistance, so that if a fully reflective load is connected to the input side as well, and reflection occurs there as well, the level thereof possibly leads to oscillation. With regard to filters in particular, at frequencies near the skirt of the filter characteristics, at which the response of the filter changes sharply, phase rotation increases in speed, causing a tendency to oscillate.

Figure 4:
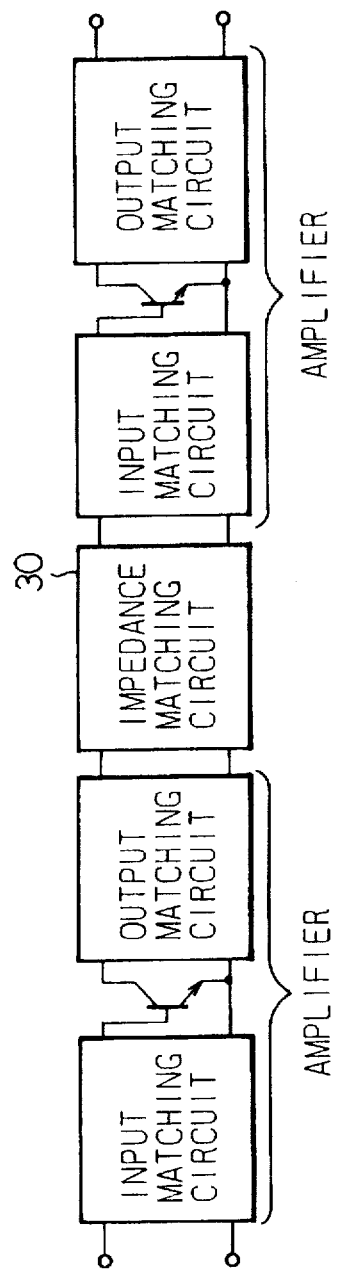
FIG. 4 is a block diagram which shows an example of the multistage-connected configuration of an amplifier in the prior art.

FIG. 4 shows an example of the configuration in the case of a multistage-connected amplifier of the prior art. As shown in FIG. 4, an impedance-matching circuit 30 was inserted between each amplifier stage, to avoid the above-described problem of oscillation.

FIGS. 5(a) through 5(e) show examples of impedance-matching circuits of the prior art.

In impedance matching circuits, the method is used with a resistance connected as a buffer, either in series or parallel, between each transistor amplifier block (such as in FIGS. 5(a) and 5(b)), or to form a resistive T-type or π-type attenuator (such as in FIGS. 5(c) and 5(d)) between each transistor amplifier block so as to attenuate the signal below the oscillation limit.

However, in implementing an impedance matching circuit, such as described above, with resistive elements only, the application of such elements in a receiving circuit causes attenuation of the signal, this being accompanied by a deterioration of the noise figure.

For this reason, the bridged-Tee circuit shown in FIG. 5(e) is generally used in a receiving system. The bridged-Tee circuit is a filter for the purpose of absorbing signals outside the passband without attenuating the signal frequency of interest (frequencies within the passband). However, the use of this circuit increases the size of the circuit, making a compact implementation difficult.

Figure 6:
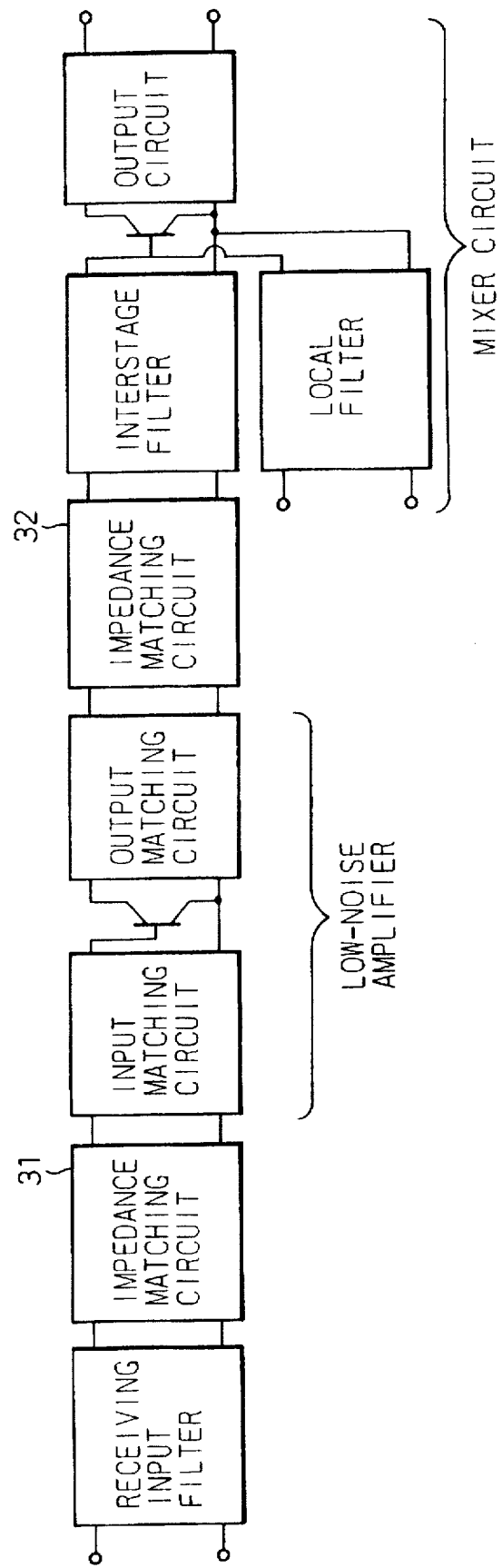
FIG. 6 is a block diagram which shows an example of the compound-connection configuration of an amplifier and a mixer in the prior art.

FIG. 6 shows an example of the configuration of a compound circuit of the prior art, formed from an amplifier and a mixer circuit.

For the reasons described above, an impedance matching circuit is used, as shown in FIG. 6. In the case of a compound circuit formed by a low-noise amplifier and a mixer circuit, in addition to the problems, the following problem occurs.

When a high-level low-frequency signal is input to a low-noise amplifier, a harmonic signal is generated therewithin, and if the frequency thereof coincides with the frequency of interest, this can cause interference to reception. It is not possible to solve this problem even by inserting a filter between the low-noise amplifier and the mixer circuit, the problem only being solvable by providing a filter for this purpose at the input side of the low-noise amplifier.

However, because the said filter must have a prescribed attenuation at image frequencies and local frequencies, requiring the filter also to have 5/2, 5/3, . . . , attenuation characteristics, where f is the frequency of interest, increases the insertion loss of the filter, thereby representing an obstacle in achieving overall low noise in the receiving circuit.

Next, to gain an understanding of the concept of the present invention shown in FIG. 20 and FIG. 21, examples of circuit connections of an amplifier or the like using a bias circuit according to the present invention will be described.

Figure 20:
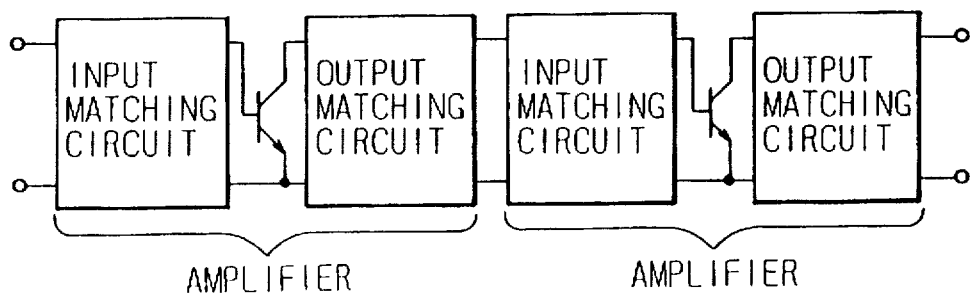
FIG. 20 is a block diagram which shows an example of a multistage-connected configuration of an amplifier according to the present invention.
Figure 21:
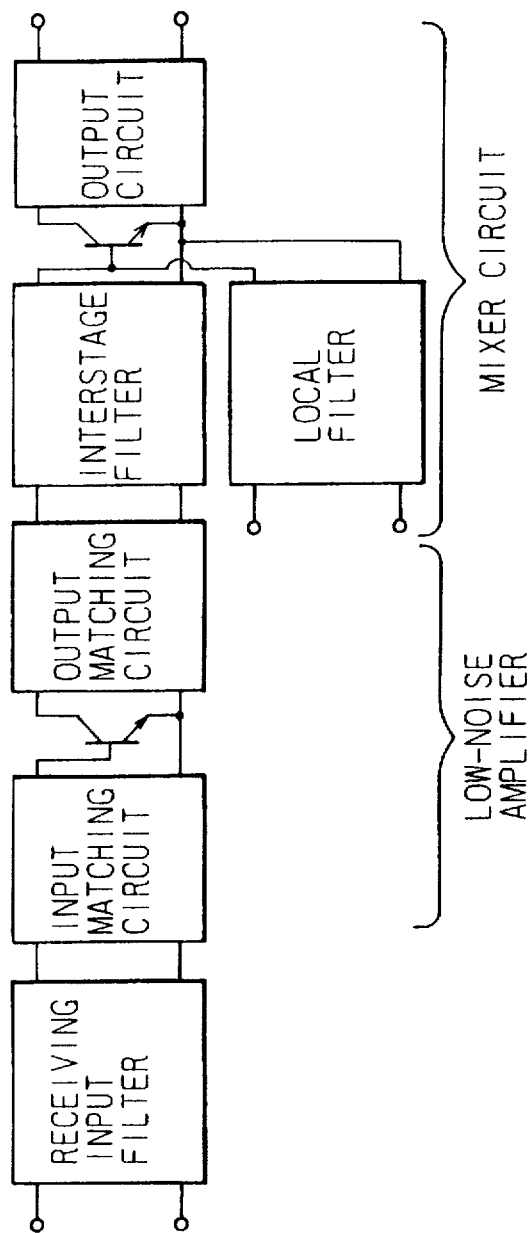
FIG. 21 is a block diagram which shows an example of a compound-connection configuration of an amplifier and a mixer in the related art.

FIG. 20 shows an example of the configuration of a multistage-connected amplifier which uses a bias circuit according to the present invention, and FIG. 21 shows an example of the configuration of a compound circuit formed by an amplifier and a mixer circuit, which uses a bias circuit according to the present invention.

The difference between FIGS. 20 and 21 and the above-described FIGS. 4 and 6, is that in FIGS. 20 and 21 the impedance-matching circuits 30 through 32 of the prior art have been eliminated. This is because the impedance-matching circuits 30 through 32 are included as part of the bias circuit in the present invention. With this configuration in mind, the present invention will be now be described.

Figure 7:
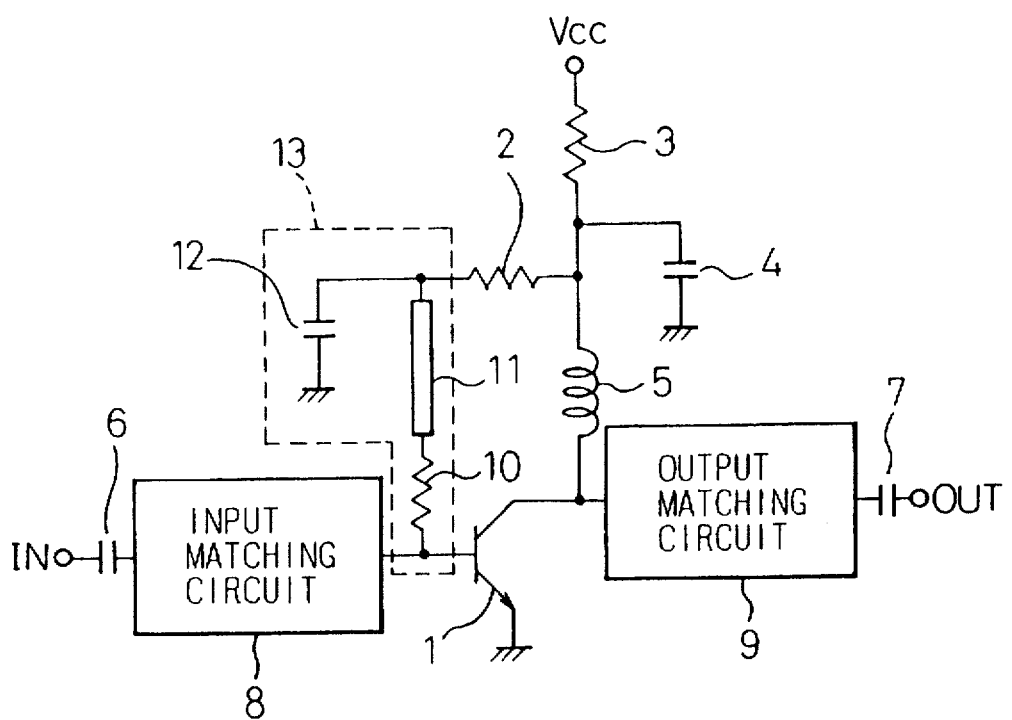
FIG. 7 is a circuit diagram which shows a bias circuit at the base side, which uses a distributed-constant line according to the present invention.

FIG. 7 shows an example of the configuration of a bias circuit at the base side, which uses a distributed-constant line, according to the present invention.

In FIG. 7, a resonant circuit 13, formed by a resistance 10, a distributed-constant line (πg/4) 11, and a capacitor 12, is added to the transistor amplifier of the past. A bias current is also supplied to the base via this resonant circuit 13. The circuit elements other than the resonant circuit 13 are the same as the already-described circuit of the prior art, and will therefore not be further described herein.

Figure 8A:
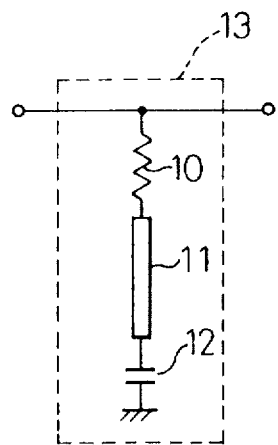
FIGS. 8(a) through 8(c) are drawings which show the basic circuit configuration and circuit characteristics, which illustrate the principle of operation of the bias circuit of FIG. 7.
Figure 8B:
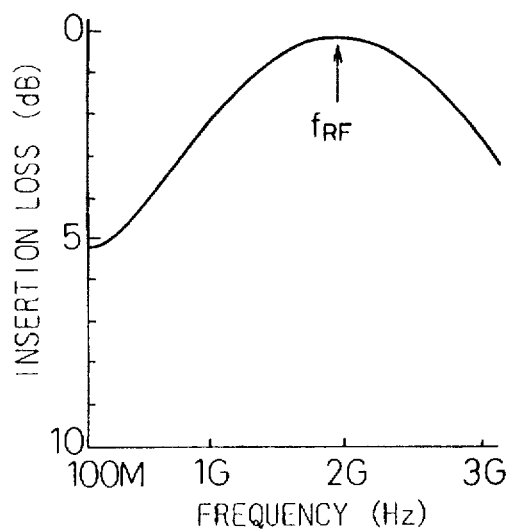
Figure 8C:
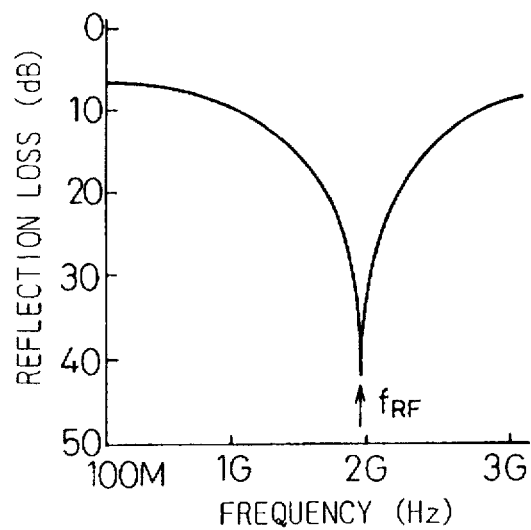

FIGS. 8(a) through 8(c) illustrate the operating principle of just the resonant circuit 13 alone.

FIG. 8(a) shows the basic circuit configuration of the resonant circuit 13. FIG. 8(b) shows the insertion loss characteristics and FIG. 8(c) shows the reflection loss characteristics. These insertion loss characteristics and reflection loss characteristics are the characteristics of the circuit of FIG. 8(a), with resistance 10=30 Ω and capacitance C=1000 pF, and with the input and output impedances of 50 Ω.

In the case of using a resistive attenuator parallel-connected to the transmission path as in the prior art, it is possible to expect an attenuation of 5.3 dB with a resistance value of 30 Ω, an attenuation of 7.0 dB with a resistance value of 20 Ω, and an attenuation of 10.9 dB with a resistance value of 10 Ω, with the signal frequency being attenuated, in this case, by the same amount.

In contrast to this, in the present invention, as shown in FIG. 8(b), by inserting a distributed-constant line (λ/4) 11, which is open at the signal frequency of 1.9 GHz ($f_{RF}$), the resistance 10, and the capacitor 12, it is possible by means of the resonant circuit 13 not only to achieve the required attenuation of a low-frequency signal in the region of 100 MFz, but to do this without attenuating the signal frequency ($f_{RF}$).

Therefore, it is possible to eliminate low-frequency oscillations in the case of the above-described multistage-connected transistor amplifier, without attenuating the signal frequency of interest ($f_{RF}$). By doing this, stable operation is achieved in a multistage-connected or compound circuit cf.

By appropriately selecting the length of the distributed-constant line 11 and the circuit constant represented by the capacitor 12, it is possible to achieve adjustment to a negative resistance, caused by the connected load, to a high-Q resonant frequency, in which case the resistance 10 establishes the damping constant.

Figure 9:
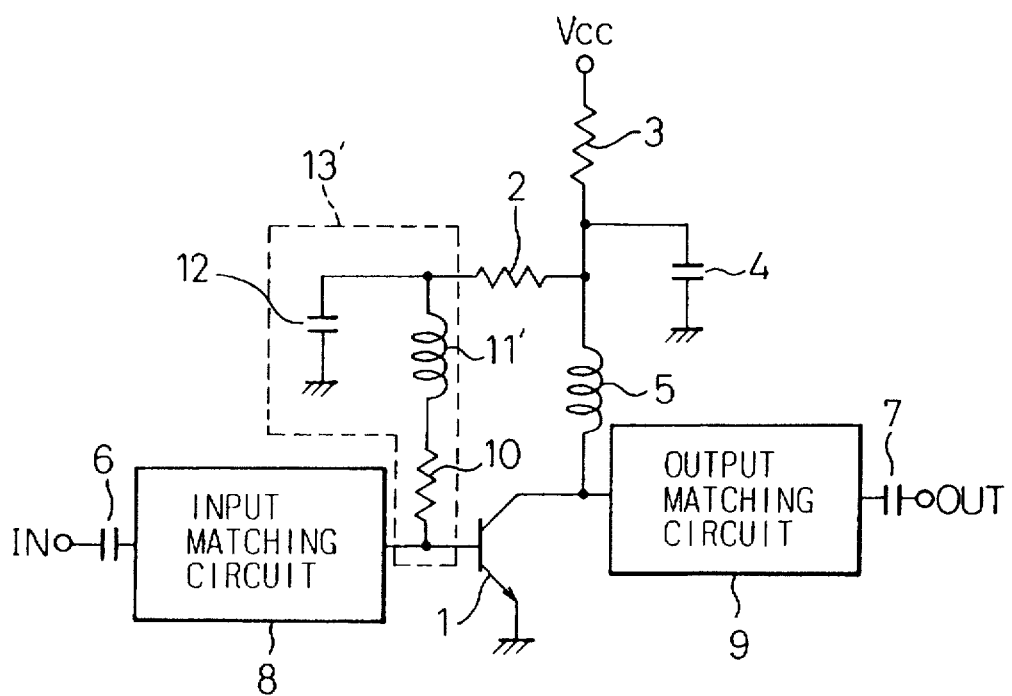
FIG. 9 is a circuit diagram which shows a bias circuit which uses a lumped-constant inductor according to the present invention.

FIG. 9 shows an example of the configuration of a bias circuit according to the present invention, using a lumped-constant inductor 11' in place of the above-described distributed-constant line 11.

Figure 10A:
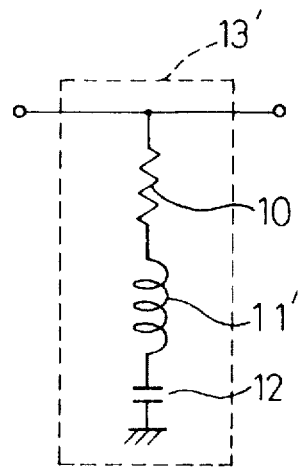
FIGS. 10(a) through 10(c) are drawings which show the basic circuit configuration and circuit characteristics, which illustrate the principle of operation of the bias circuit of FIG. 9.
Figure 10B:
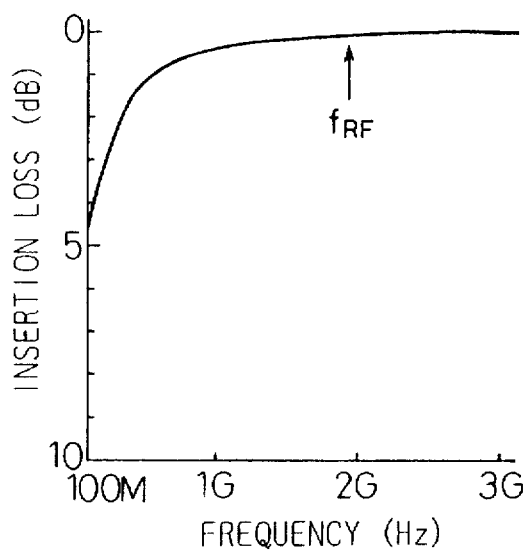
Figure 10C:
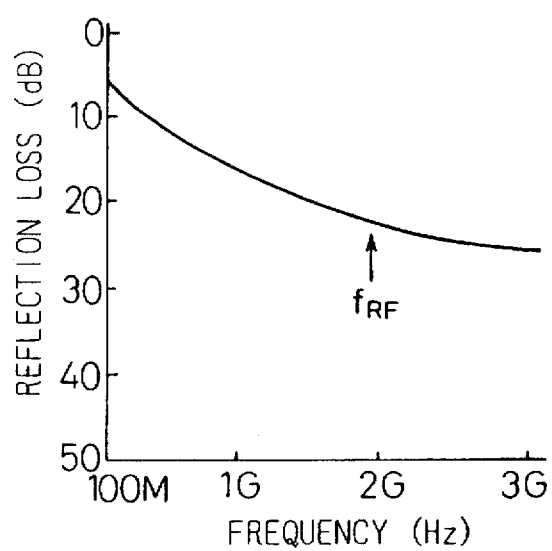

FIGS. 10(a) through 10(c) illustrate the operating principle of just the resonant circuit 13' of FIG. 9, in the same manner as FIGS. 8(a) through 8(c).

The insertion loss characteristics of FIG. 10(b) and the reflection loss characteristics of FIG. 10(c) show another example of characteristics which can be achieved by appropriate selection of the LCR circuit elements 10', 11', and 12'.

Figure 11:
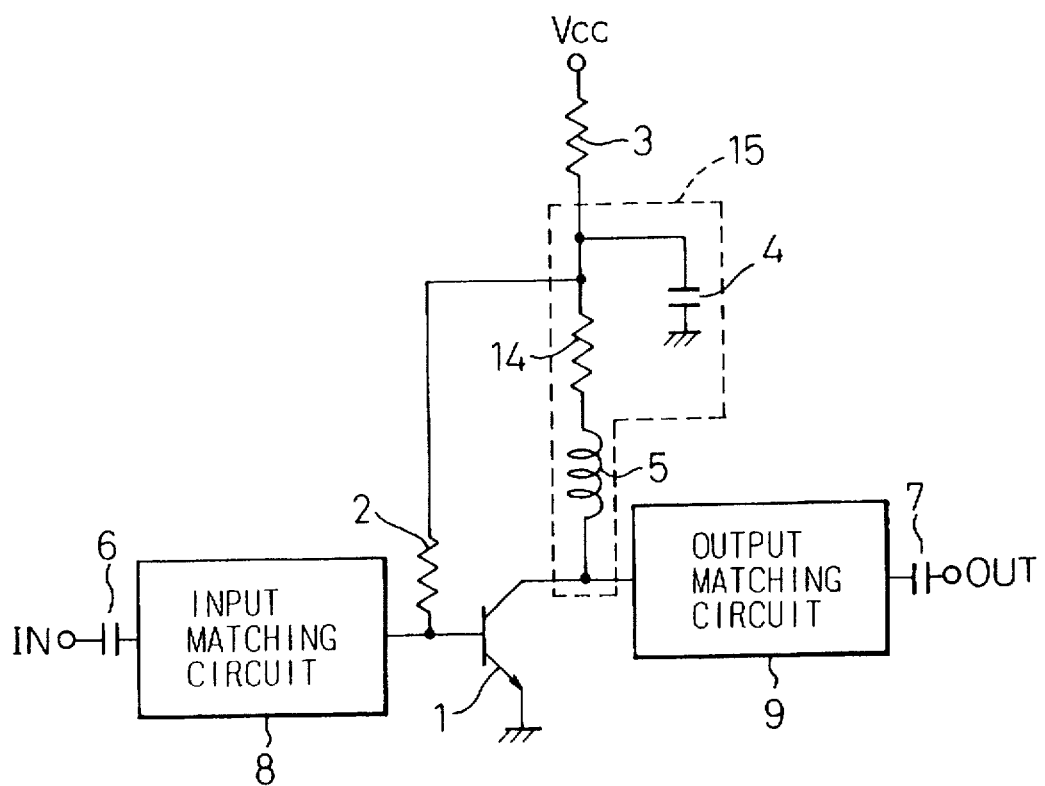
FIG. 11 is a circuit diagram which shows a bias circuit at the collector side, which uses a distributed-constant line according to the present invention.

FIG. 11 shows an example of an amplifier circuit using a bias circuit according to the present invention at the collector side.

Figure 12A:
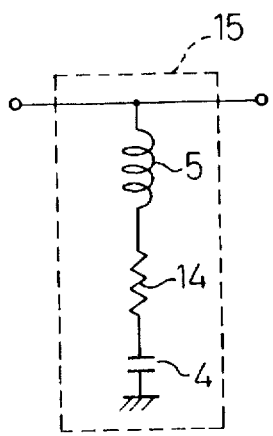
FIGS. 12(a) through 12(c) are drawings which show the basic circuit configuration and circuit characteristics, which illustrate the principle of operation of the bias circuit of FIG. 11.
Figure 12B:
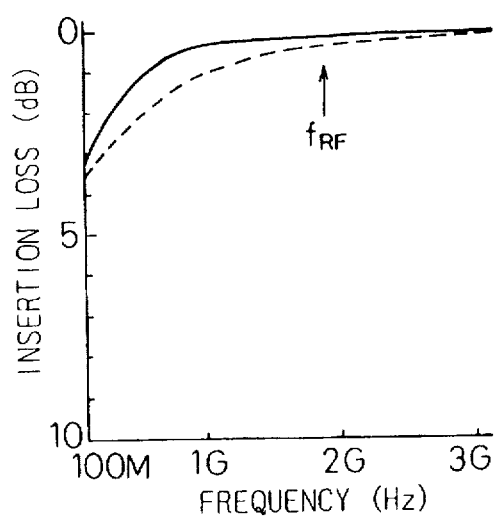
Figure 12C:
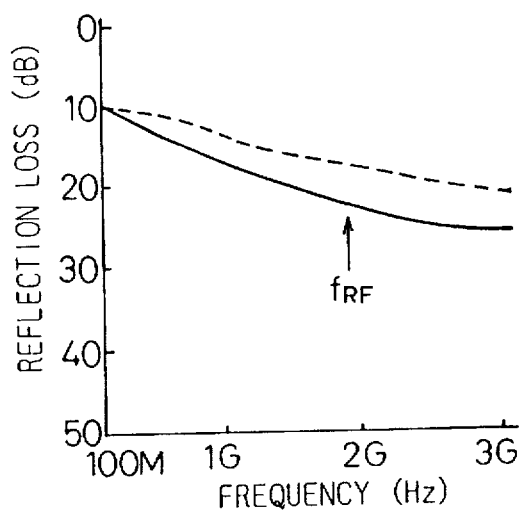

FIGS. 12(a) through 12(c) illustrate the operating principle of just the resonant circuit 15 of FIG. 11.

The insertion loss characteristics of FIG. 12(b) and the reflection loss characteristics of FIG. 12(c) show that, by using a lumped-constant inductor having a self-resonant frequency removed from the signal frequency ($f_{RF}$) and, for example, a resistance of 50 Ω and a capacitor of 1000 pF, it is possible to attenuate frequency components in the region of the signal frequency as shown by the broken line in FIG. 12(b). By doing this, it is possible to impart an attenuation to a filter, for example, which passes the signal frequency, in the frequency region in which the phase changes rapidly.

Figure 13:
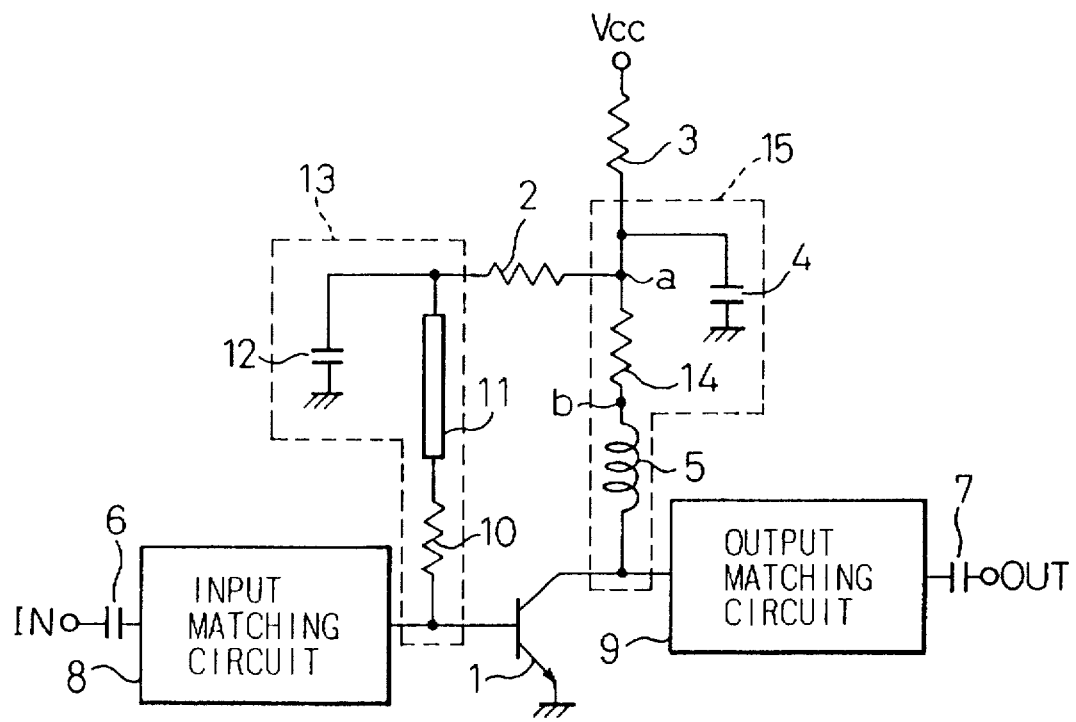
FIG. 13 is a circuit diagram which shows an example of an amplifier circuit having a bias circuit according to the present invention, both at the base side and at the collector side.
Figure 14:
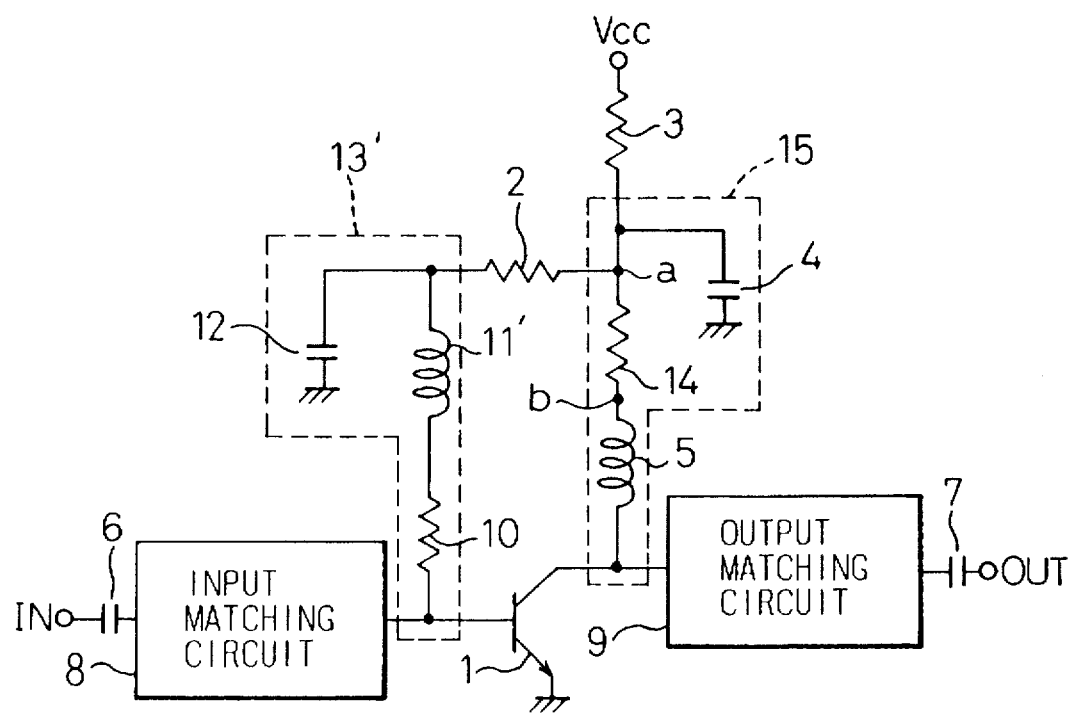
FIG. 14 is a circuit diagram which shows another example of an amplifier circuit having a bias circuit according to the present invention, both at the base side and at the collector side.

FIG. 13 and FIG. 14 show examples of an amplifier circuit having a bias circuit according to the present invention at both the base and the collector.

FIG. 13 shows the case in which a distributed-constant line 11 is used, whereas FIG. 14 shows the case in which a lumped-constant inductor 11' is used. Because, as previously described, the resistance 2 is a high resistance of several kilohms, the operation of the bias circuits at the input and output sides is separate. By using a configuration in which the bias circuit is provided at both the input and the output, it is possible to prevent positive feedback, thereby providing an amplifier with stable operation outside the passband. In FIG. 13 and FIG. 14, although resistance 2 is connected at point a, it can be connected at point b in either Figure.

Figure 15A:
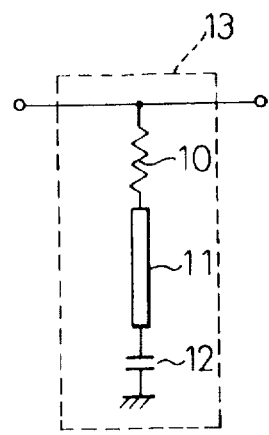
FIGS. 15(a) through 15(c) are drawings which show the basic circuit configuration and circuit characteristics, which illustrate the principle of operation of a trap circuit according to the present invention.
Figure 15B:
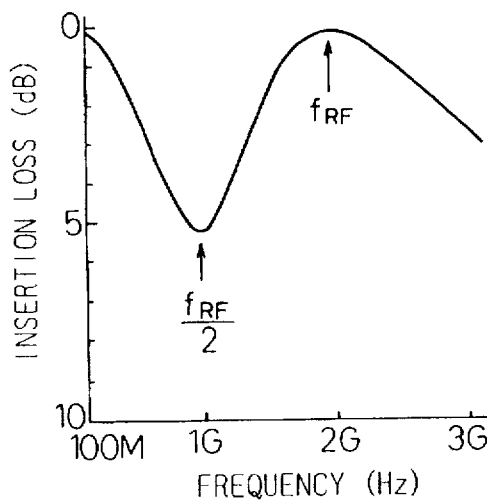
Figure 15C:
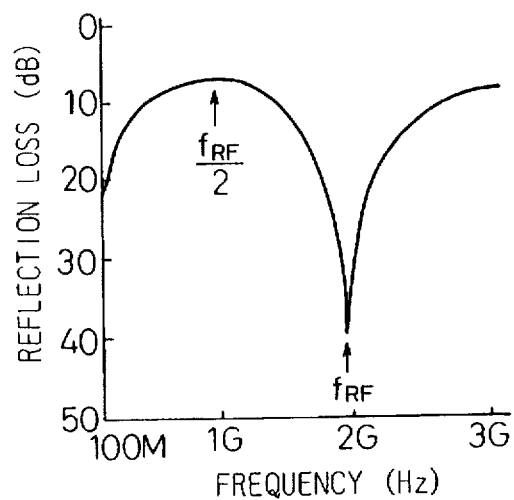

FIGS. 15(a) through 15(c) show an example of a trap circuit, according to the present invention, illustrating the example of trapping a frequency of ½ the signal frequency. This trap circuit can also be implemented as part of the bias circuit.

FIG. 15(a) shows the basic circuit configuration of the resonant circuit 13 which forms the trap circuit, with FIG. 15(b) showing the insertion loss characteristics and FIG. 15(c) showing the reflection loss characteristics thereof. As shown in FIG. 15(a), in this example, the signal frequency is passed without attenuation, but a signal component of ½ thereof, which can cause the generation of a harmonic, is attenuated by ($f_{RF}/2$).

Therefore, by forming the bias circuit at the input side (base side ) of FIG. 13, as described above, and selecting the circuit constants of the length of the distributed-constant line 11 and the capacitor 12 so as to trap a frequency that is an integral fraction of the signal frequency when bias is supplied, it is possible to block, at the input of a low-noise amplifier, signals of a frequency that is an integral fraction of the signal frequency, which would cause harmonics that cause interference to reception.

Figure 16A:
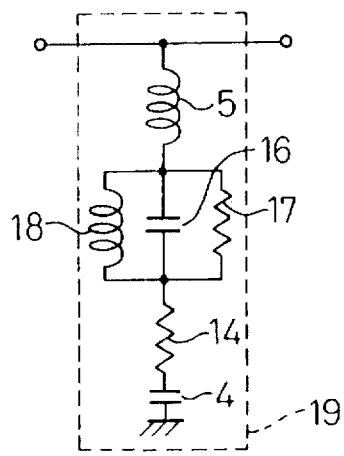
FIGS. 16(a) through 16(c) are drawings which show the basic circuit configuration and circuit characteristics, which illustrate the principle of operation of a parallel LCR resonant circuit according to the present invention.
Figure 16B:
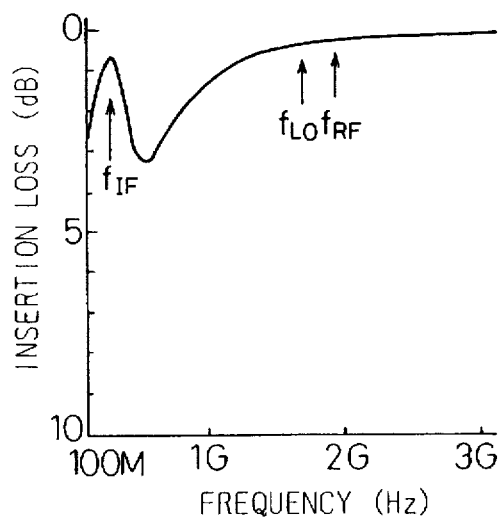
Figure 16C:
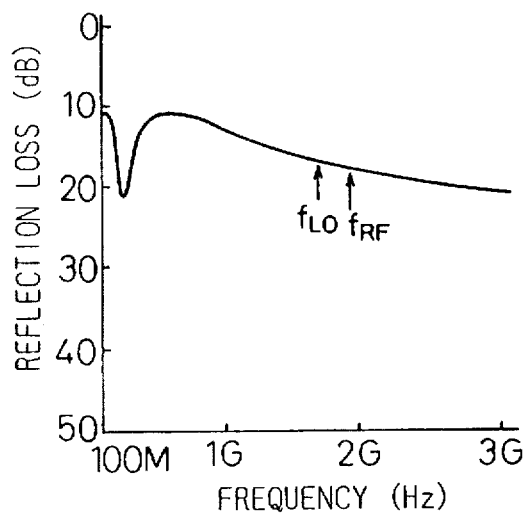

FIGS. 16(a) through 16(c) show examples of the configuration and characteristics of a bias circuit (including a trap function) with a further added LCR parallel resonant circuit according to the present invention.

Figure 17A:
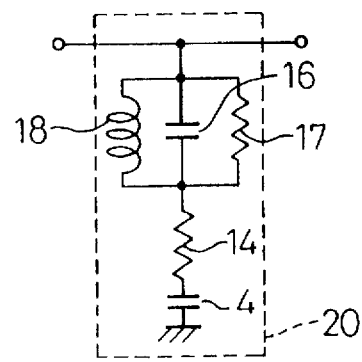
FIGS. 17(a) through 17(c) are drawings which shows the basic circuit configuration and circuit characteristics, which illustrate the principle of operation of another parallel LCR resonant circuit according to the present invention.

The only difference in circuit configuration between FIG. 16(a) and FIG. 17(a) is the existence or non-existence of the lumped-constant inductor 5. By adding such an inductor and capacitor to increase the order of the filter, it is possible to implement more complex characteristics (refer to FIGS. 16(b) and 16(c) and to FIGS. 17(b) and 17(c)).

FIG. 16(b) shows the example of the result of seeking to somewhat attenuate frequencies other than the resonant frequency of the resonant circuit 19, by means of the inductor 5 and the resonant circuit formed by the inductor 18, the capacitor 16, and the resistance 17 and, for example, a resistance 14 of 50 Ω and a capacitor 4 of 1000 pF. The values of the lumped-constant inductor 18 and the capacitor 16 in this circuit are selected so as to open the circuit at the IF frequency, and the resistance 17 can be connected to perform Q damping.

Figure 17B:
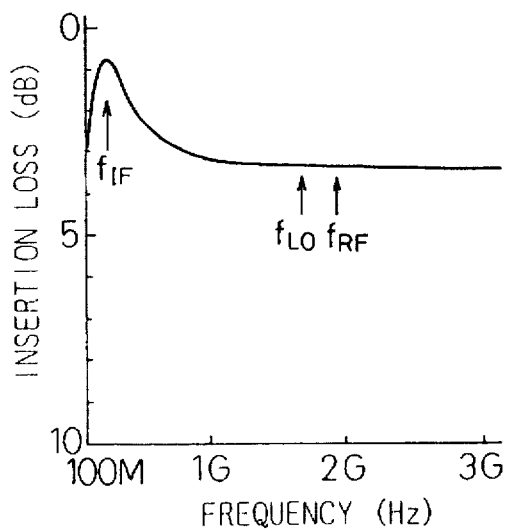
Figure 17C:
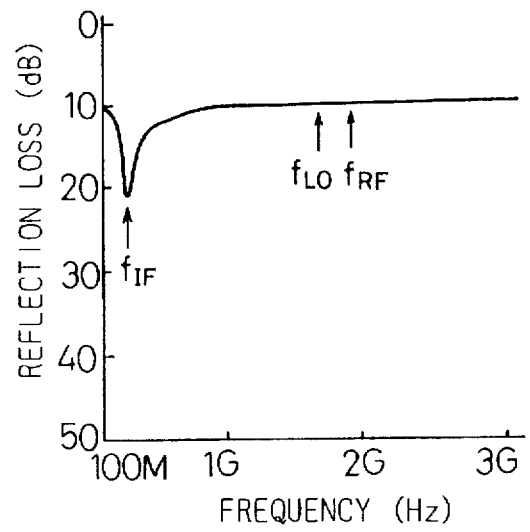

FIG. 17(b) shows the result of seeking to somewhat attenuate frequencies other than the resonant frequency of the resonant circuit 20, similar to the said example, by means of the resonant circuit formed by inductor 18, the capacitor 16, and the resistance 17 and, for example, a resistance 14 of 50 Ω and a capacitor 4 of 1000 pF. In this example, the characteristics are such that although the IF frequency is passed without attenuation, the signal frequency ($f_{RF}$) and local frequency ($f_{LO}$) are attenuated.

In this circuit, the values of the lumped-constant inductor 18 and the capacitor 16 in this circuit are selected so as to open the circuit at the IF frequency, and the resistance 17 can be connected to perform Q damping.

Figure 18:
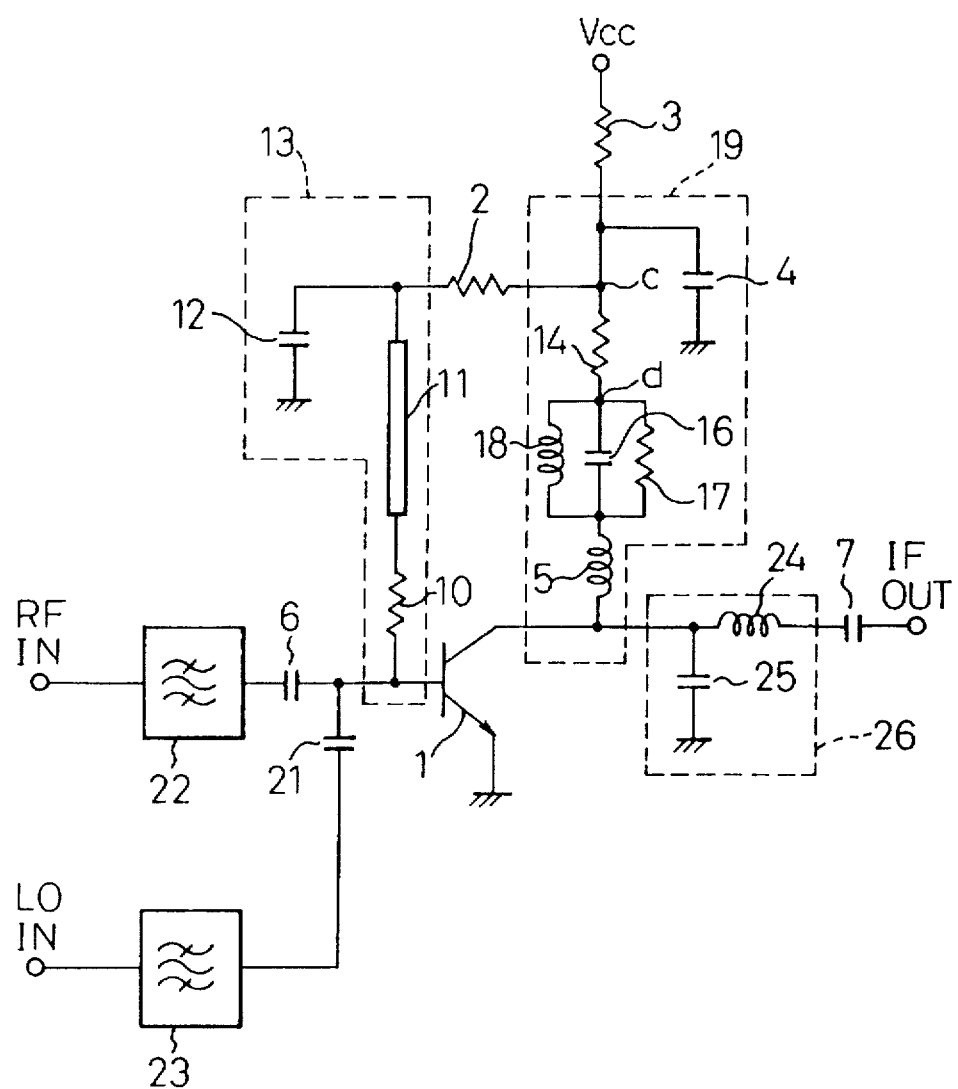
FIG. 18 is a circuit diagram which shows an example of a mixer circuit having a bias circuit according to the present invention at both the base side and the collector side.
Figure 19:
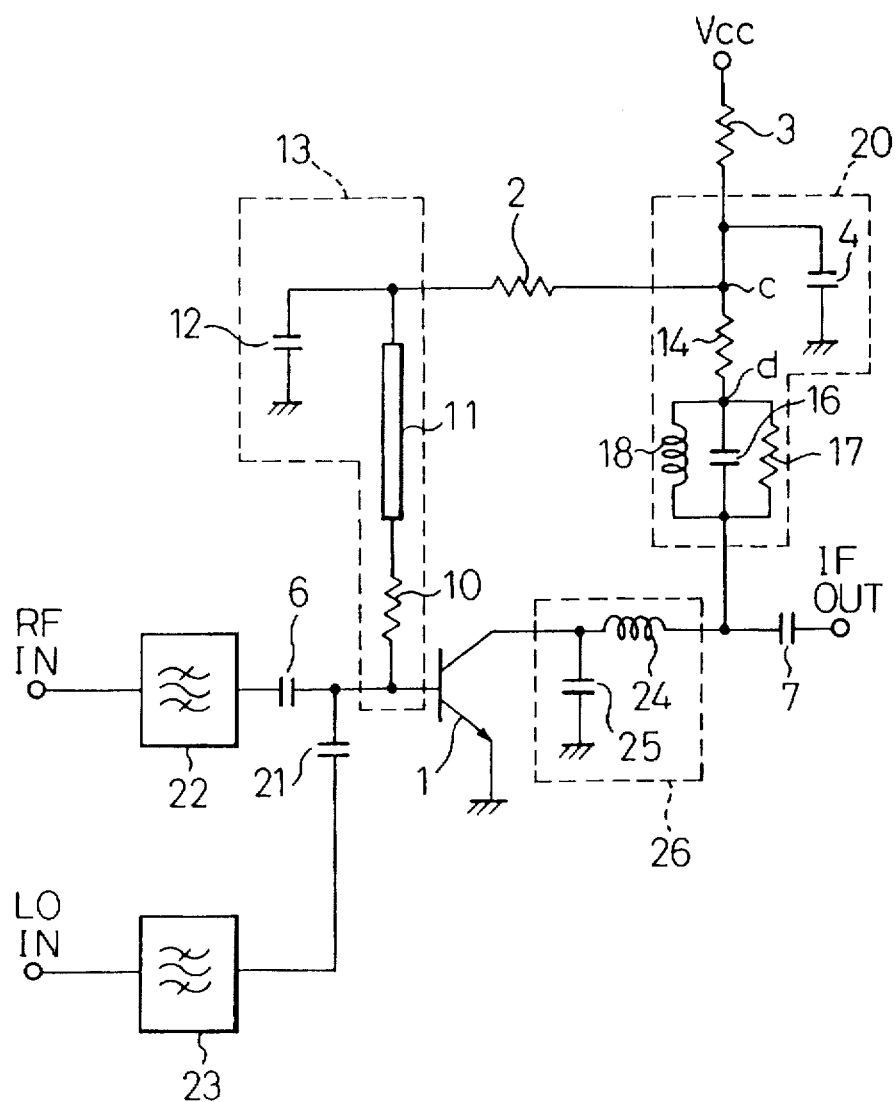
FIG. 19 is a circuit diagram which shows another example of a mixer circuit having a bias circuit according to the present invention at both the base side and the collector side.

FIG. 18 and FIG. 19 show examples of mixer circuits which have bias circuits with a trap functions according to the present invention provided at both their base and collector sides.

As shown in FIG. 18 and FIG. 19, by providing the bias circuit of FIG. 7 at the input side (base side) and providing the bias circuit of FIG. 17(a) and FIG. 17(a) at the output side, positive feedback is prevented as described above, thereby enabling the provision of a mixer circuit with stable operation outside the passband.

While in both FIG. 18 and FIG. 19 the resistance 2 is connected at point c, it can be connected at point d as well in either Figure. Because the bias circuit of FIG. 16 presents almost no attenuation to the signal frequency ($f_{RF}$) and the local frequency ($f_{LO}$), the bias circuit is connected as shown in FIG. 18 before the lowpass filter (LPF). In contrast to that arrangement, in the case of the bias circuit of FIG. 17(a), which attenuates the signal frequency ($f_{RF}$) and the local frequency ($f_{LO}$), the bias circuit is connected as shown in FIG. 19 after the lowpass filter (LPF). In the bias circuit at the input side (base side), when supplying bias via the resonant circuit having the resistance 10, the distributed-constant line (λg/4) and the capacitor 12 (FIG. 8(a)), by selecting the circuit constant of the capacitor so that the circuit is open even at the IF frequency, the IF signal converted by the transistor is prevented from being shorted to ground by this bias circuit, thereby providing stable operation, without a deterioration in mixer circuit performance.

As described above, the present invention enables a reduction in the low-frequency gain and trapping of unwanted frequencies, without attenuation of the signal frequency.

By doing this, in the case of a multistage-connected amplifier, if circuit such as a filter, which is fully reflective outside its passband is used, and in the case of a compound circuit which surrounds an amplifier circuit and mixer circuit, it is possible to achieve stable operation, without influencing the noise performance of the said circuits.

Furthermore, it is possible to achieve a compact, economical circuit implementation of a bias circuit having the above-described function, without the addition of a new complex circuit.

What is claimed is:

1. A bias circuit which establishes an operating point of a transistor, said bias circuit comprising:

an input biasing means which is connected with a signal input terminal of the transistor, and which applies a bias current to said signal input terminal from a power supply, said input biasing means including an input frequency selection means which passes an AC input signal input to said signal input terminal within a prescribed frequency band, and which attenuates an AC input signal input to said signal input terminal outside said prescribed frequency band.

2. A bias circuit which establishes an operating point of a transistor, said bias circuit comprising:

an output biasing means which is connected with a signal output terminal of the transistor, and which applies a bias current to said signal output terminal from a power supply, said output biasing means including an output frequency selection means which passes an AC output signal output from said signal output terminal within a prescribed frequency band to a circuit directly connected to said signal output terminal, and which attenuates an AC output signal output from said signal output terminal outside said prescribed frequency band.

3. A bias circuit which establishes an operating point of a transistor, said bias circuit comprising:

an input biasing means which is connected with a signal input terminal of the transistor, and which applies a bias current to said signal input terminal from a power supply, said input biasing means including an input frequency selection means which passes an AC input signal input to said signal input terminal within a prescribed frequency band, and which attenuates an AC input signal input to said signal input terminal outside said prescribed frequency band; and an output biasing means which is connected with a signal output terminal of the transistor, and which applies a bias current to said signal output terminal from a power supply, said output biasing means including an output frequency selection means which passes an AC output signal output from said signal output terminal outside said prescribed frequency band.

4. The bias circuit according to claim 1, wherein said input frequency selection means attenuates low-frequency components of said AC input signal and passes high-frequency components of said AC input signal, thereby compensating for a gain versus frequency characteristics of the transistor.

5. The bias circuit according to claim 3, wherein said input frequency selection means attenuates low-frequency components of said AC input signal and passes high-frequency components of said AC input signal, thereby compensating for a gain versus frequency characteristics of the transistor.

6. The bias circuit according to claim 1, wherein said input frequency selection means traps a frequency component of an integral fraction of a frequency of said AC input signal.

7. The bias circuit according to claim 3, wherein said input frequency selection means traps a frequency component of an integral fraction of a frequency of said AC input signal.

8. The bias circuit according to claim 2, wherein said output frequency selection means passes an intermediate frequency IF, and attenuates a radio frequency RF and a local frequency LF.

9. The bias circuit according to claim 3, wherein said output frequency selection means passes an intermediate frequency IF, and attenuates a radio frequency RF and a local frequency LF.

10. The bias circuit according to claim 1, wherein said input frequency selection means is a resonant circuit formed by a resistor, a capacitance, and a lumped-constant inductance.

11. The bias circuit according to claim 2, wherein said output frequency selection means is a resonant circuit formed by a resistor, a capacitance, and a lumped-constant inductance.

* * * * *